(12) United States Patent
O'Leary

(10) Patent No.: US 10,715,123 B1
(45) Date of Patent: Jul. 14, 2020

(54) ERROR CORRECTION FOR STEPWISE SIGNAL MODIFICATION CIRCUITS

(71) Applicant: pSemi Corporation, San Diego, CA (US)

(72) Inventor: Mark James O'Leary, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/448,930

(22) Filed: Jun. 21, 2019

(51) Int. Cl.
*H03K 5/01* (2006.01)
*H03K 5/00* (2006.01)

(52) U.S. Cl.
CPC ..... *H03K 5/01* (2013.01); *H03K 2005/00286* (2013.01)

(58) Field of Classification Search
CPC .................. H03K 5/01; H03K 2005/00286
USPC .................................. 327/231, 233–235, 237
See application file for complete search history.

(56) References Cited

U.S. PATENT DOCUMENTS

| | | | |
|---|---|---|---|
| 9,397,635 B2 | 7/2016 | Costa | |
| 9,634,650 B2 | 4/2017 | Allison et al. | |
| 10,062,946 B2 | 8/2018 | Sharma et al. | |
| 2009/0278549 A1* | 11/2009 | Ma | H03K 5/135 324/537 |
| 2016/0380623 A1* | 12/2016 | Allison | H03K 5/08 327/237 |

OTHER PUBLICATIONS

Sharma, et. al., "High Resolution Attenuator or Phase Shifter with Weighted Bits", patent application filed in the USPTO on Jun. 20, 2018, U.S. Appl. No. 16/013,844, 55 pgs.

* cited by examiner

*Primary Examiner* — Tomi Skibinski
(74) *Attorney, Agent, or Firm* — Jaquez Land Greenhaus LLP; John Land, Esq.

(57) ABSTRACT

Circuits and methods for correction of errors in multi-stage stepwise signal modification circuits. Embodiments of the invention also provide flexibility to correct accuracy errors over a range of conditions, such as differences in signal frequency and/or temperature. A first embodiment includes sorting actual values of a multi-stage stepwise signal modification circuit to generate a monotonic listing of actual values; mapping input codes to a new order of codes corresponding to the sorted actual values; and providing mapping functionality to convert each input code into a mapped output code. A second embodiment includes searching, for each ideal value corresponding to an input code, all actual values of a multi-stage stepwise signal modification circuit for the actual value closest to the ideal value; mapping input codes to a new order of codes corresponding to the closest actual values; and providing mapping functionality to convert each input code into a mapped output code.

20 Claims, 16 Drawing Sheets

400

420

630

640

*1000*

*1020*

ERROR CORRECTION FOR STEPWISE SIGNAL MODIFICATION CIRCUITS

CROSS-REFERENCE TO RELATED APPLICATIONS

This invention may be related to the following patents and/or patent applications, all assigned to the assignee of the present invention, the contents of all of which are incorporated by reference:

U.S. patent application Ser. No. 16/013,844, filed Jun. 20, 2018, entitled "High Resolution Attenuator or Phase Shifter with Weighted Bits";

U.S. Pat. No. 9,397,635, issued Jul. 19, 2016, entitled "Segmented Attenuator with Glitch Reduction";

U.S. Pat. No. 9,634,650, issued Apr. 25, 2017, entitled "State Change Stabilization in a Phase Shifter/Attenuator Circuit"; and U.S. Pat. No. 10,062,946, issued Aug. 28, 2018, entitled "Reflection-Based RF Phase Shifter".

BACKGROUND

(1) Technical Field

This invention generally relates to electronic circuits, and more specifically to electronic error correction circuits and methods for stepwise signal modification circuits such as attenuators and/or phase shift circuits.

(2) Background

A number of electronic circuits, particularly circuits designed to convey radio frequency signals, include multiple coupled stages that together provide for stepwise modification or transformation of an applied input signal.

As one example of a stepwise signal modification circuit, a digital step attenuator (DSA) is an electronic device that reduces the power of an applied signal in discrete steps without appreciably distorting its waveform. DSA's are frequently used with radio frequency (RF) systems such as transceivers for broadcast radio, cellular telephones, and RF based digital networks (e.g., WiFi, Bluetooth).

Typical DSA's consist of a series cascade of switchable two-state attenuator stages. For example, FIG. 1 is a schematic diagram of a prior art binary-weighted DSA 100. Shown are four series-connected attenuator stages 102a-102d. Under the control of a selector 104 that decodes a supplied input control code into individual control lines 106, each attenuator stage 102a-102d may be switched to an active "attenuate" state or to a "bypass" state (also known as a "reference state"). Each attenuator stage 102a-102d may be regarded as having a "bit position" associated with one individual control line 106. In this example, a 4-bit input control code applied to the selector 104 can set 16 combinations of attenuation, from no added attenuation (i.e., all stages in a bypass state) to 15 dB of attenuation (i.e., all stages in an attenuation state), with a minimum step size of 1 dB. Additional background regarding DSA's may be found in the above-referenced patent application entitled "High Resolution Attenuator or Phase Shifter with Weighted Bits".

Digital phase shifter (DPS) circuits are another example of a stepwise signal modification circuit. DPS circuits are used to change the transmission phase angle of a signal, and are commonly used to phase shift RF signals. RF phase shifter circuits may be used for applications such as in-phase discriminators, beam forming networks, power dividers, linearization of power amplifiers, and phased array antennas.

Typical DPS circuits are digitally controlled sets of serially-connected multiple phase shifter stages that provide a discrete set of phase states that are selected by a control word or code, directly or after decoding, similar to a DSA 100. For example, FIG. 2 is a schematic diagram of a prior art binary-weighted DPS 200. Shown are four series-connected phase shifter stages 202a-202d. Under the control of a selector 204 that decodes a supplied input control code into individual control lines 206, each phase shifter stage 202a-202d may be switched to an active "phase shift" state or to a "bypass" state (also known as a "reference state"). Each phase shifter stage 202a-202d may thus be regarded has having a "bit position" associated with one individual control line 206. In this example, a 4-bit input control code applied to the selector 204 can set 16 combinations of phase shift, from no added phase shift (i.e., all stages in a bypass state) to 168.75° of phase shift (i.e., all stages in a phase shift state), with a minimum step size of 11.25°. Additional background regarding DPS's may be found in the above-referenced patent application entitled "High Resolution Attenuator or Phase Shifter with Weighted Bits".

In DSA's and DPS's such as the examples above, it is common to describe each attenuator stage or phase shifter stage as being assigned a bit position corresponding to one of the individual control lines 106, 206 from an associated selector 104, 204. For example, in FIG. 1, attenuator stage 102d may be regarded as associated with the most significant bit (MSB) of a 4-bit binary-weighted control word or code, while attenuator stage 102a may be regarded as associated with the least significant bit (LSB) of the 4-bit binary-weighted control word or code. A binary-weighted control code of "1001" would set attenuator stages 102d and 102a to active attenuation states (totaling 9 dB in the illustrated example) while attenuator stages 102b, 102c would be set to bypass (reference) states. A similar mapping of control code bits to phase shifter stages may be applied to the DPS 200 shown in FIG. 2.

While the above examples of DSA's and DPS's use binary-weighted control words or codes, other bit position weighting schemes commonly used are thermometer weighting (i.e., an incremental or decremental change in attenuation or phase shift value with each unit of change of state) and hybrid thermometer/binary weightings. A further description of such conventional weightings may be found in the above-referenced patent application entitled "Segmented Attenuator with Glitch Reduction".

In practice, DSA's, DPS's, and other multi-stage stepwise signal modification circuits (e.g., digital-to-analog converters, or DAC's) generally exhibit an error in one or more stages. This leads to distortion in the signal modification (e.g., attenuation, phase shift, etc.) versus control code values, which adversely affects accuracy, differential non-linearity, and integral non-linearity.

For example, FIG. 3A is a graph 300 of ideal and actual stage attenuation as a function of nominal stage attenuation for a modeled 6-stage binary weighted DSA with 0.25 dB resolution. The DSA may be implemented as a six-stage version of the four-stage DSA 100 example shown in FIG. 1. Assume the modeled DSA is designed as six binary-weighted stages with nominal per stage attenuation of 8, 4, 2, 1, 0.5, and 0.25 dB, respectively. Thus, in this example, from right to left, each stage ideally should have exactly twice the attenuation of the previous stage (left hand bars for each attenuation stage code position). However, due to imperfection of components or other variations, such as varying attenuation as a function of frequency, the actual per stage attenuations in this example are 8.75, 3.5, 2.27, 1.20, 0.4 and 0.3 dB, respectively. FIG. 3B is a graph 310 of the error (delta) between the ideal and actual attenuation values shown in FIG. 3A as a function of nominal stage attenuation code.

FIG. 3C is a graph 320 of ideal attenuation and modeled actual multi-stage attenuation as a function of binary control codes for the DSA represented in FIG. 3A.

For a 6-stage DSA, there are $2^6$ (64) control codes. Ideally, each input code (ranging from decimal 0-63 in this example) should cause the selected stages of the DSA to have a combined attenuation value that would fall exactly on an ideal straight line 320. Since the stages are not ideal attenuators, the actual output attenuation values instead fall on a curve 322. Notably, large jumps in attenuation generally occur where a next most significant bit (MSB) stage is activated, such as around decimal code value 15, 31, and 47. For example, as shown within the dotted circle 326, the attenuation at code value 32 (binary 100000) jumps significantly from the attenuation at code value 31 (binary 011111) as a next MSB stage is activated. However, in some cases, a next higher code results in a lower attenuation level rather than a higher attenuation level; such is the case within the dotted circle 324, where the attenuation at code value 16 (binary 010000) is lower than at code value 15 (binary 001111) as a next MSB stage is activated.

FIG. 3D is a graph 330 of differential non-linearity (DNL) 332 and integral non-linearity (INL) 334 as a function of binary control codes for the DSA represented in FIG. 3A. The deviation of the illustrated DNL graph line in particular from 0 dB demonstrates significant error in the attenuation characteristic given the example stage errors.

There is a need for high accuracy in multi-stage stepwise signal modification circuits. If such errors are systematic, they generally can be corrected by redesigning the circuit, but such redesign may be cost prohibitive for some processes or applications. Accordingly, there is a need for correction of accuracy errors in multi-stage stepwise signal modification circuits that avoids redesigning the circuits. It would also be useful if such correction provided flexibility to correct accuracy errors over a range of conditions, such as differences in signal frequency and/or temperature. The present invention provides a solution that meets these needs and more.

SUMMARY

The present invention encompasses circuits and methods for correction of accuracy errors in multi-stage stepwise signal modification circuits that avoids redesigning the circuits. Embodiments of the invention also provide flexibility to correct accuracy errors over a range of conditions, such as differences in signal frequency and/or temperature.

A first embodiment includes sorting actual values of a multi-stage stepwise signal modification circuit to generate a monotonic listing of actual values; mapping input codes to a new order of codes corresponding to the sorted actual values; and providing mapping functionality to convert each input code to a multi-stage stepwise signal modification circuit into a mapped output code.

A second embodiment includes searching, for each ideal value corresponding to an input code, all actual values of a multi-stage stepwise signal modification circuit for the actual value closest to the ideal value; mapping input codes to a new order of codes corresponding to the closest actual values; and providing mapping functionality to convert each input code to a multi-stage stepwise signal modification circuit into a mapped output code.

The details of one or more embodiments of the invention are set forth in the accompanying drawings and the description below. Other features, objects, and advantages of the invention will be apparent from the description and drawings, and from the claims.

10A is a graph of ideal attenuation and modeled actual multi-stage attenuation as a function of binary control codes for a 5-bit DSA, using corrected and mapped input codes.

Figure 10A:
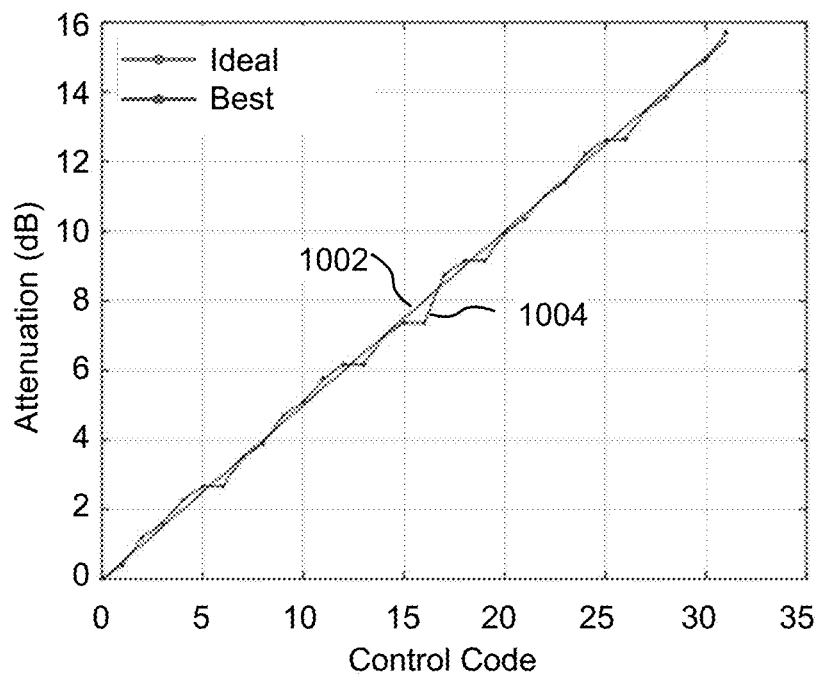
Figure 10B:
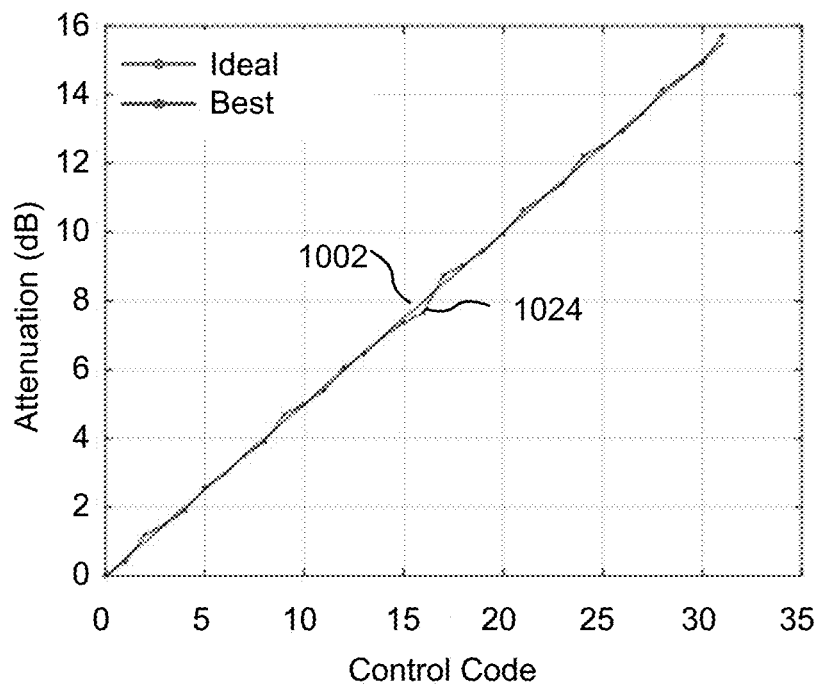

FIG. 10B is a graph of ideal attenuation and modeled actual multi-stage attenuation as a function of binary control codes for the 5-bit DSA of FIG. 10A, using an extra bit of resolution to map output codes.

Figure 11A:
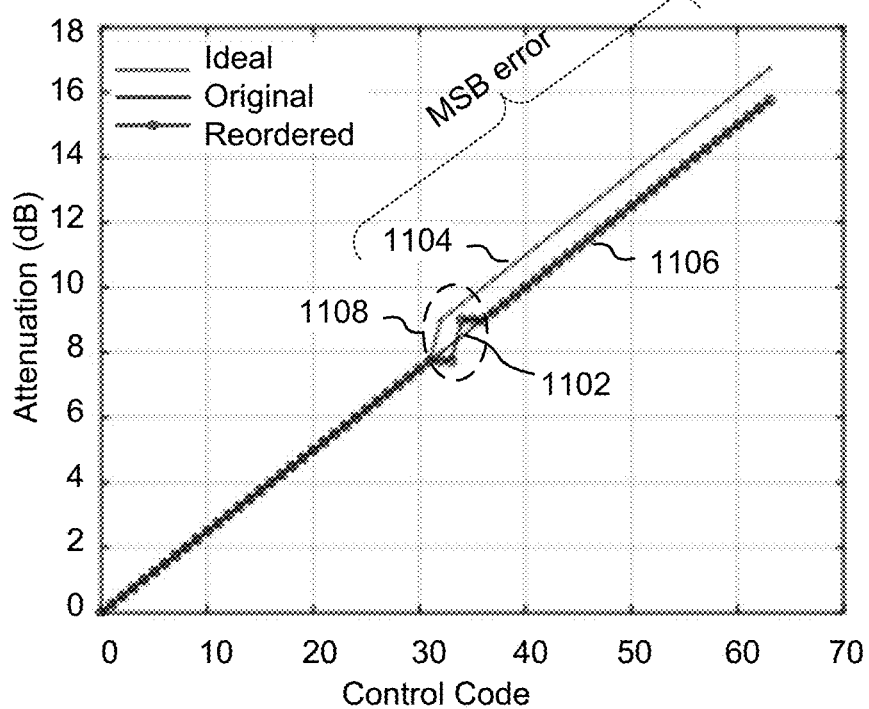

FIG. 11A is a graph of ideal attenuation, original multi-stage attenuation, and reordered multi-stage attenuation, all as a function of binary control codes for a 6-bit DSA.

Figure 11B:
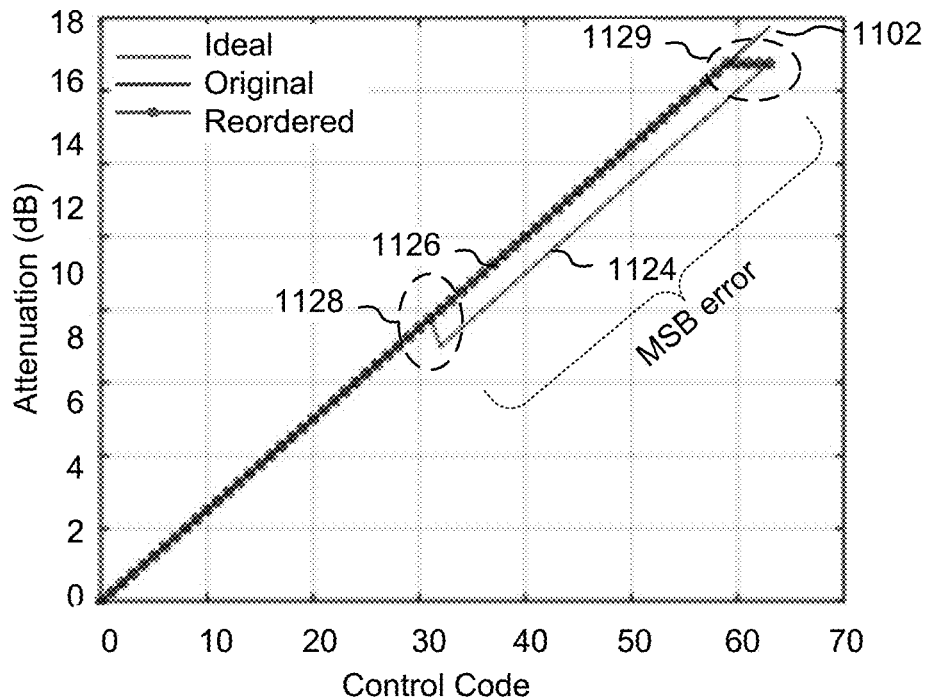

FIG. 11B is a graph of ideal attenuation, original multi-stage attenuation using a lesser-valued MSB stage, and reordered multi-stage attenuation, all as a function of binary control codes for a 6-bit DSA.

Figure 11C:
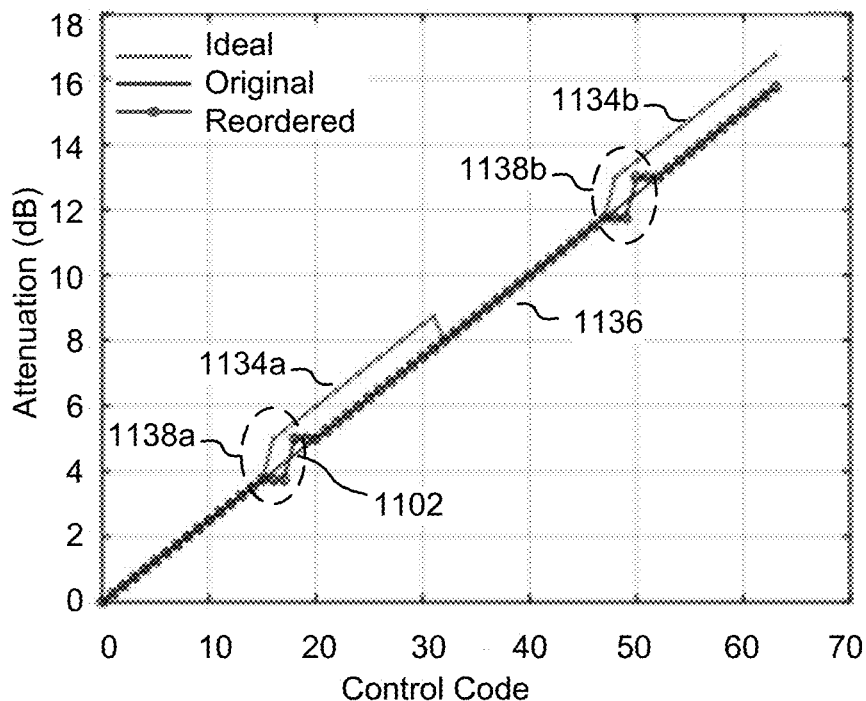

FIG. 11C is a graph of the resulting characteristics for the error vector [X, 1, 0, 0, 0, 0] for the 6-bit DSA of FIG. 11A.

Figure 11D:
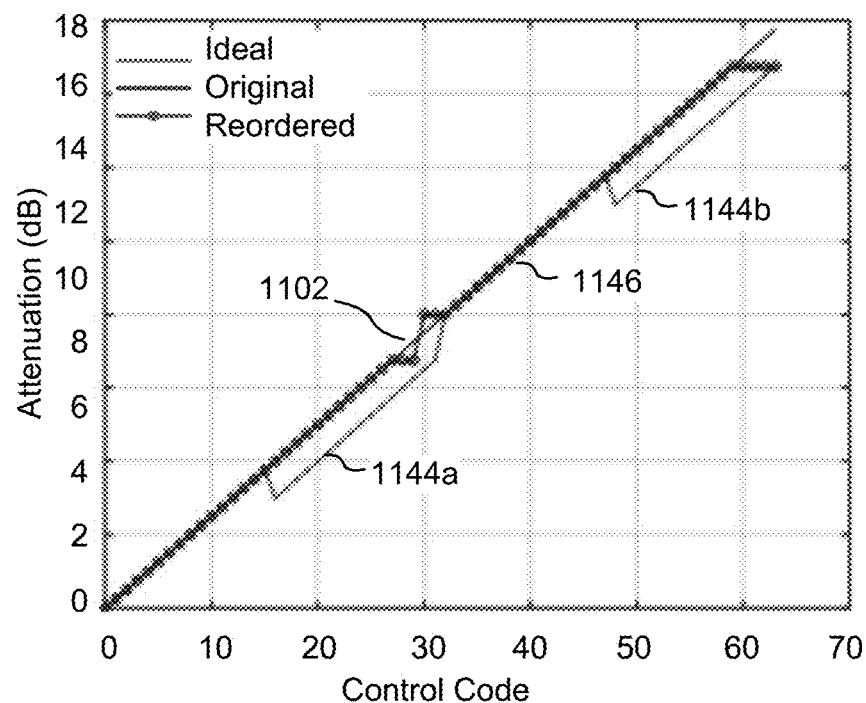

FIG. 11D is a graph of the resulting characteristics for the error vector [X, 1, 0, 0, 0, 0] for the 6-bit DSA of FIG. 11A, but using a negatively biased next most significant bit stage (i.e., the $N^{th}-1$ stage).

Figure 11E:
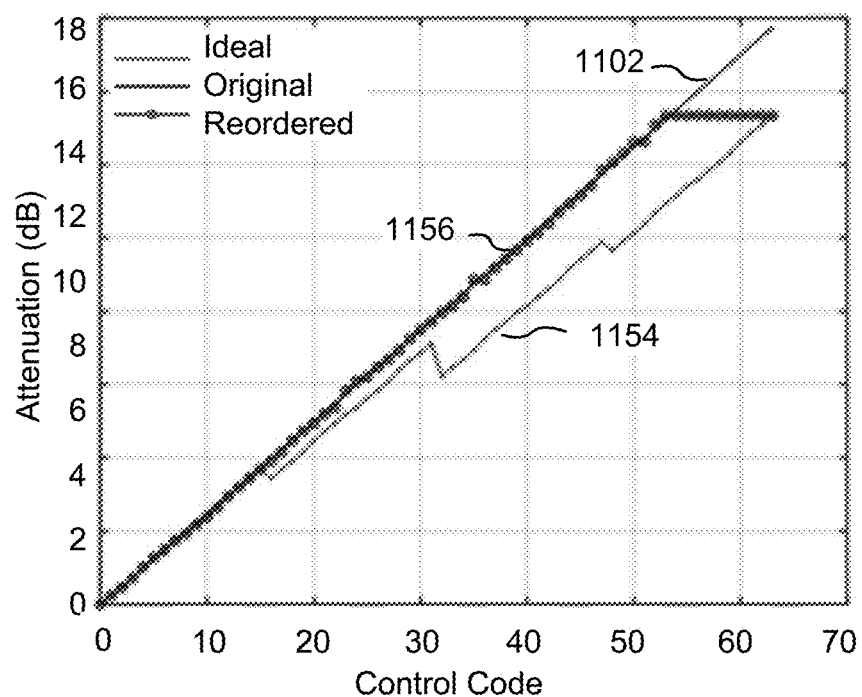

FIG. 11E is a graph showing plots of the combined negative bias and resulting reordering error correction of the embodiments shown in FIGS. 11B and 11D.

Figure 12A:
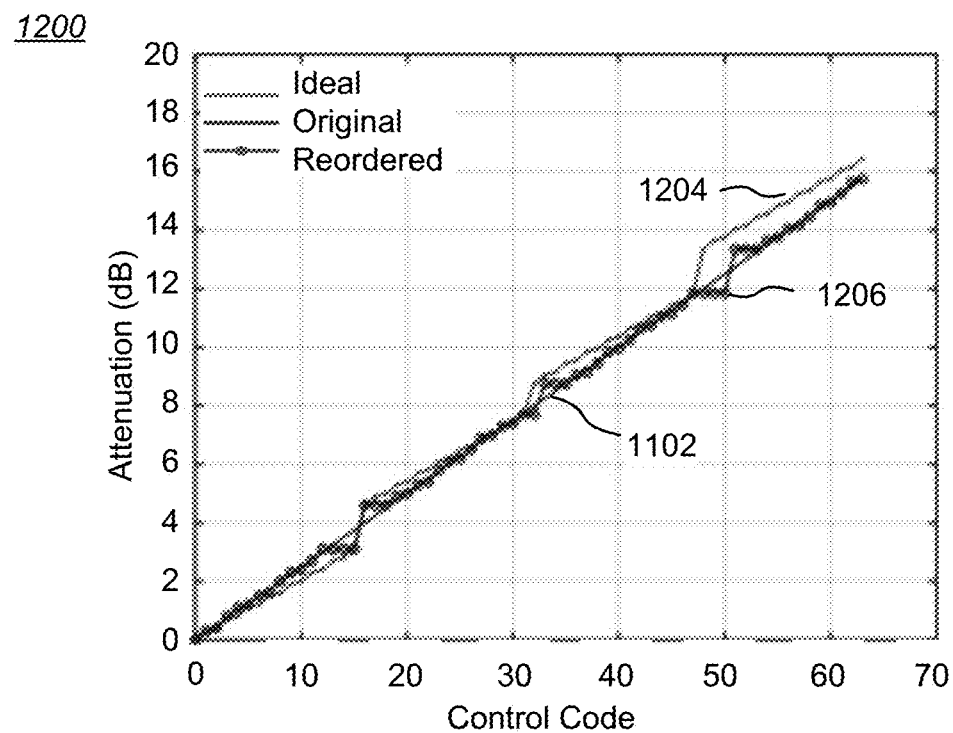

FIG. 12A is a graph of ideal attenuation, original multi-stage attenuation, and reordered multi-stage attenuation, all as a function of binary control codes for an example 6-bit DSA in which the amount of error is uncorrectable using just bit reordering.

Figure 12B:
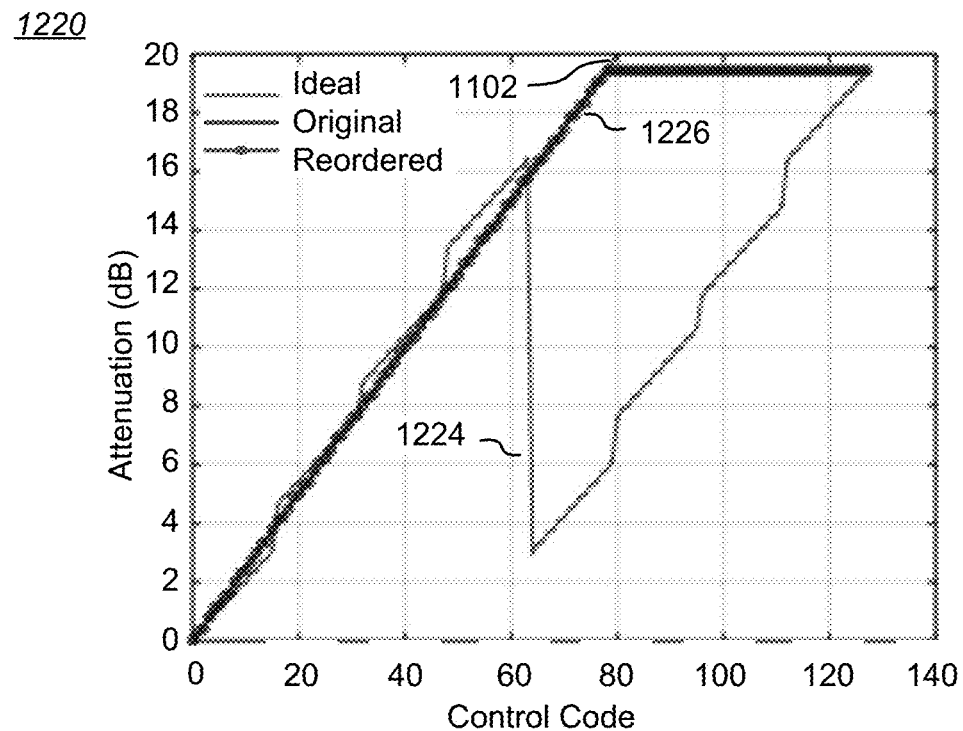

FIG. 12B is a graph of ideal attenuation, original multi-stage attenuation with an added fractional stage, and reordered multi-stage attenuation, all as a function of binary control codes for an example 7-bit DSA.

Like reference numbers and designations in the various drawings indicate like elements.

DETAILED DESCRIPTION

The present invention encompasses circuits and methods for correction of accuracy errors in multi-stage stepwise signal modification circuits that avoids redesigning the circuits. Embodiments of the invention also provide flexibility to correct accuracy errors over a range of conditions, such as differences in signal frequency and/or temperature.

For ease of explanation, the invention will be described in terms of a digital step attenuator (DSA). However, the inventive concepts apply as well to other multi-stage stepwise signal modification circuits, such as digital phase shifters (DPS's) and digital-to-analog converters (DAC's).

Sorting & Re-Ordering Embodiment

Figure 3A:
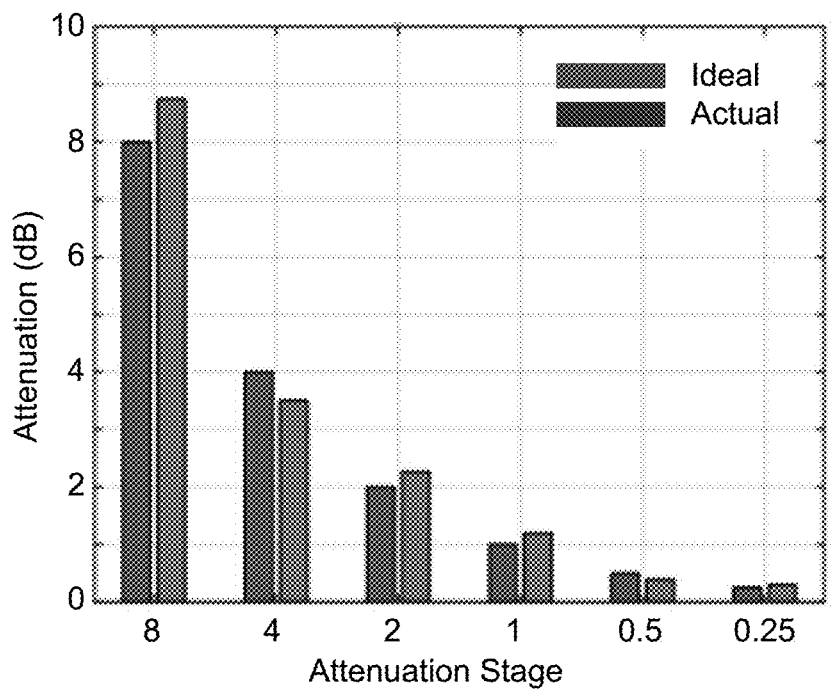
FIG. 3A is a graph of ideal and actual stage attenuation as a function of nominal stage attenuation for a modeled 6-stage binary weighted DSA with 0.25 dB resolution.
Figure 3B:
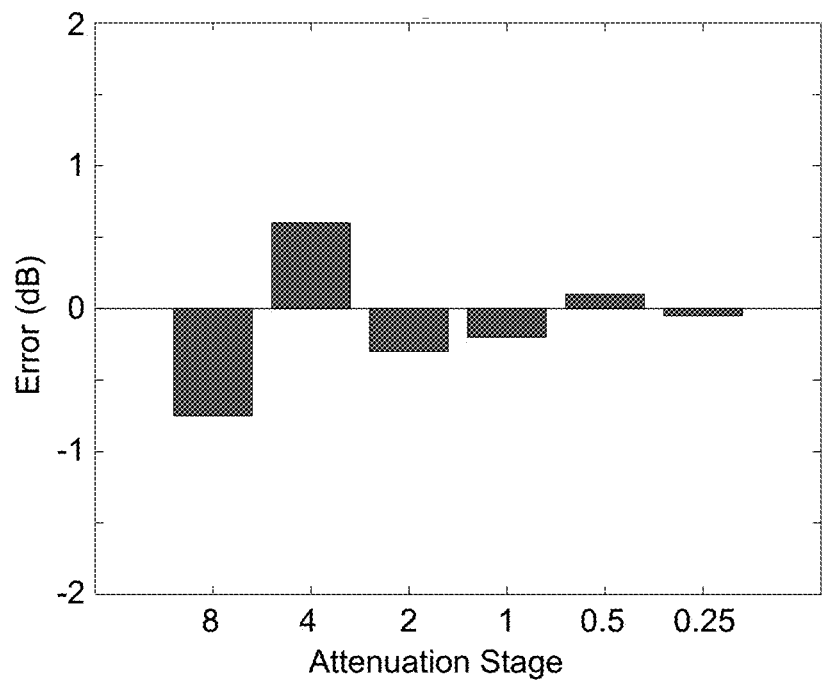
FIG. 3B is a graph of the error (delta) between the ideal and actual attenuation values shown in FIG. 3A as a function of nominal stage attenuation code.
Figure 3C:
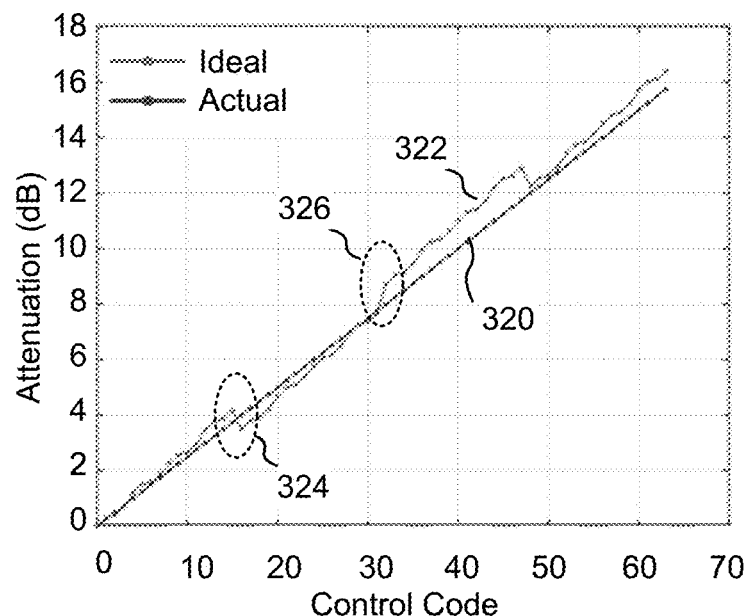
FIG. 3C is a graph of ideal attenuation and modeled actual multi-stage attenuation as a function of binary control codes for the DSA represented in FIG. 3A.
Figure 4A:
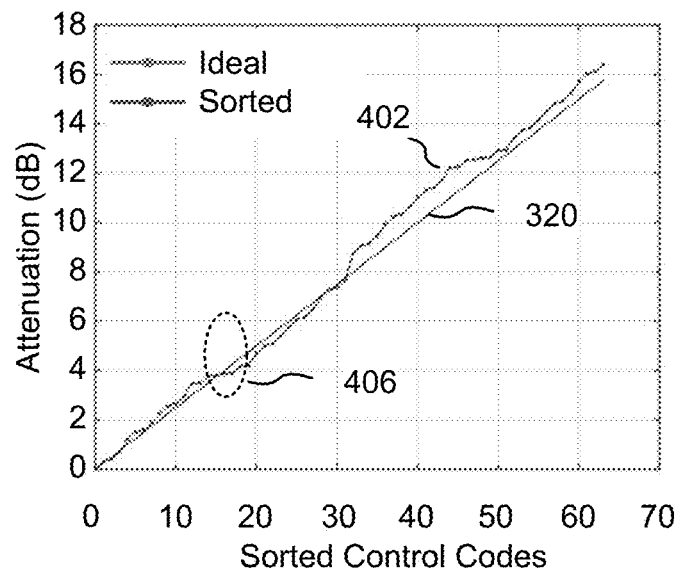
FIG. 4A is a graph showing the attenuation values of FIG. 3C sorted from lowest to highest.

As noted above, FIG. 3C is a graph 320 of ideal attenuation and modeled actual multi-stage attenuation as a function of binary control codes for the DSA represented in FIG. 3A. In a first embodiment, to at least partially correct the deviation or error of the actual curve 322 from the ideal straight line 320, the attenuation values are sorted to generate a monotonic listing of attenuation values. For example, FIG. 4A is a graph 400 showing the attenuation values of FIG. 3C sorted from lowest to highest. The result is a revised curve 402 that provides a significant improvement by forcing code-to-code transitions to be monotonic (i.e., no jumps in attenuation in an opposite direction, such as occurs in dotted circle 324 of FIG. 3C).

Because the attenuation values are sorted, the corresponding codes are no longer likely to be in sequential order. For example, after sorting, code value 15 may correspond to the attenuation level that was generated by code value 17 before sorting. Accordingly, the input codes need to be mapped to the new order of codes corresponding to the sorted attenuation values in order to convert each input code to a mapped code. The mapping functionality may be implemented, for example, in a hardware or software implemented look-up table (LUT), as software implemented conditional statements, or in combinatorial logic circuitry. Mapping circuitry may be embodied on the same integrated circuit (IC) device as a multi-stage stepwise signal modification circuit or implemented externally to such an IC device. Details of one embodiment of mapping functionality are set forth below.

Figure 3D:
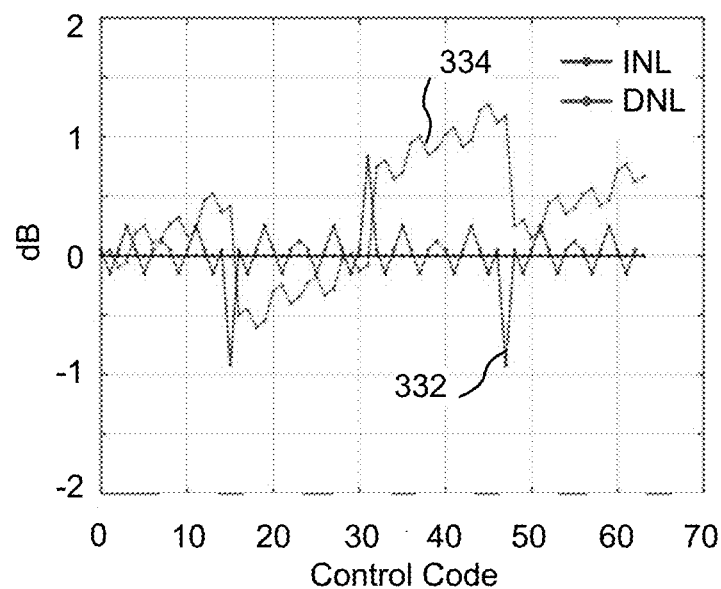
FIG. 3D is a graph of differential non-linearity (DNL) and integral non-linearity (INL) as a function of binary control codes for the DSA represented in FIG. 3A.
Figure 4B:
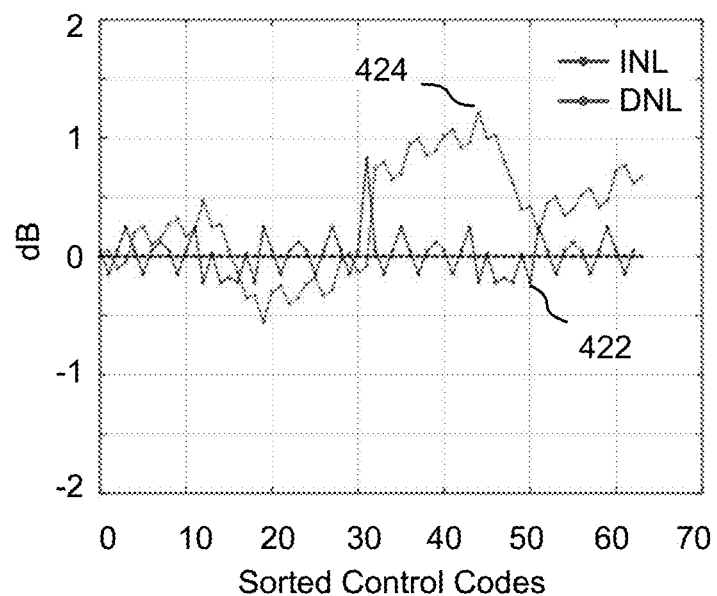
FIG. 4B is a graph of differential non-linearity (DNL) and integral non-linearity (INL) as a function of binary control codes for the corrected DSA represented in FIG. 4A.

FIG. 4B is a graph 420 of differential non-linearity (DNL) 422 and integral non-linearity (INL) 424 as a function of binary control codes for the corrected DSA represented in FIG. 4A. The deviation of DNL 422 from 0 dB is significantly reduced compared to DNL 332 in FIG. 3D. In this particular example, the RMS error improved from about 0.23 dB to about 0.18 dB. In addition, INL 424 improved in FIG. 4B compared to INL 334 in FIG. 3D.

As noted above, the sorting process described by way of a DSA example applies to any multi-stage stepwise signal modification circuit that exhibits accuracy errors of the type described above, such as a DPS or a DAC.

Figure 5:
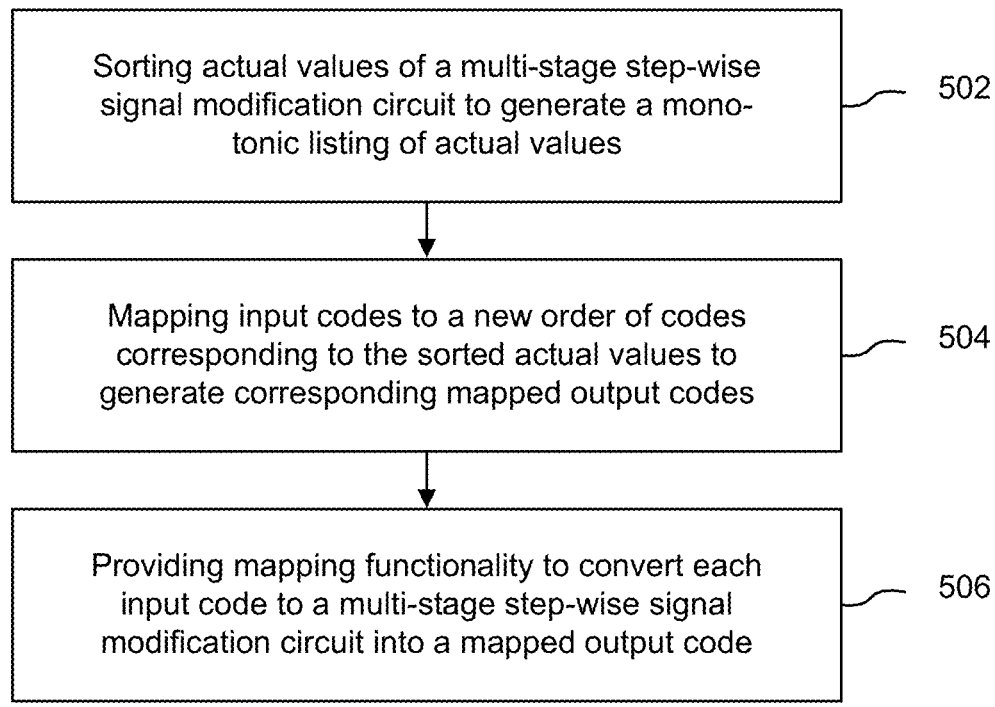
FIG. 5 is a process flow chart summarizing a first method for correcting accuracy errors in multi-stage stepwise signal modification circuits, using sorted and mapped input codes.

FIG. 5 is a process flow chart 500 summarizing a first method for correcting accuracy errors in multi-stage stepwise signal modification circuits, using sorted and mapped input codes. The process includes sorting actual values of a multi-stage stepwise signal modification circuit to generate a monotonic listing of actual values (Block 502); mapping input codes to a new order of codes corresponding to the sorted actual values to generate corresponding mapped output codes (Block 504); and providing mapping functionality to convert each input code to a multi-stage stepwise signal modification circuit into a mapped output code (Block 506).

Code Transformation Embodiment

An even greater amount of improvement with respect to accuracy error can be achieved with a second embodiment. For each control code corresponding to an ideal attenuation value, the list of all actual attenuation values is searched for the value closest in attenuation to that ideal attenuation value—essentially, a "best fit" actual attenuation value is found for each ideal attenuation value, allowing the input codes to be transformed via mapping to a new code set.

Figure 6A:
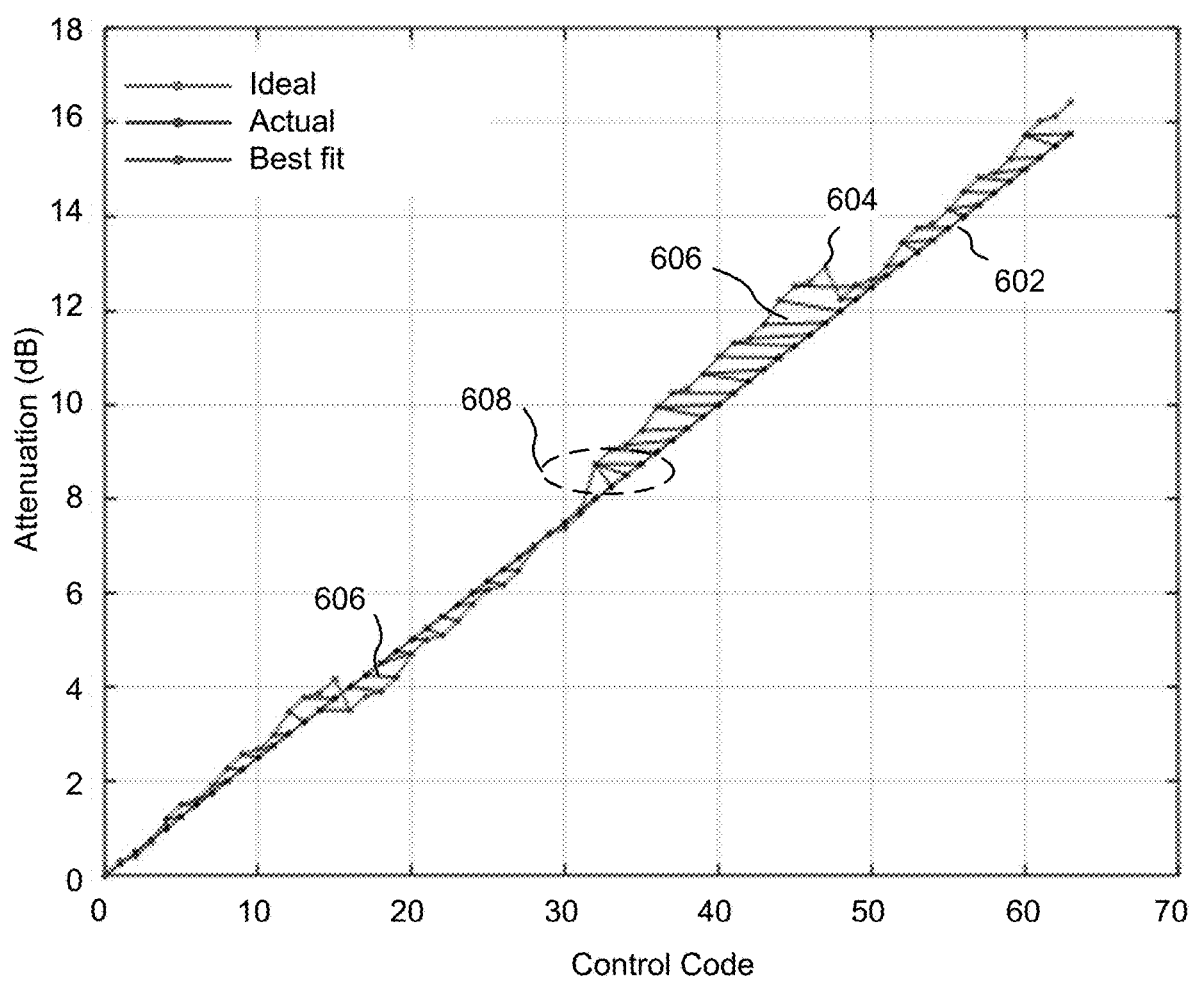
FIG. 6A is a graph of ideal attenuation and modeled actual multi-stage attenuation as a function of binary control codes for a DSA having some degree of accuracy error.

For example, FIG. 6A is a graph 600 of ideal attenuation 602 and modeled actual multi-stage attenuation 604 as a function of binary control codes for a DSA having some degree of accuracy error. Each code value corresponds to an ideal attenuation level. In the illustrated example, control code value 40 ideally causes the DSA to have an attenuation level of 10 dB. However, owing to per stage accuracy errors, code value 40 actually causes the example DSA to have an attenuation level of about 11 dB. A search of all actual attenuation values shows that an actual attenuation level very close to 10 dB corresponds to code value 36. Accordingly, input code value 40 should be mapped to code value 36. Thus, when input control code value 40 is applied to the DSA, a mapping function substitutes code value 36, and the stages of the DSA stages corresponding to code value 36 are activated.

In FIG. 6A, the short lines 606 connecting the straight line representing ideal attenuation 602 to the curve representing the modeled actual multi-stage attenuation 604 graphically show the process of this embodiment. Each short line 606 connects one ideal attenuation value corresponding to an input code to the best corresponding actual attenuation value available. In this example, control code value 30 maps to an actual attenuation value that happens to correspond to the ideal attenuation value assigned to code value 30. As noted above, control code value 40 maps to the actual attenuation value that would normally be generated by code value 36. In some cases, two or more input control codes map to the same best-fit actual attenuation value. For instance, in the illustrated example, input control code values 33, 34, and 35 best correspond to the actual attenuation value (almost 9 dB) that would normally be generated by input control code value 32 (see oval 608).

Figure 6B:
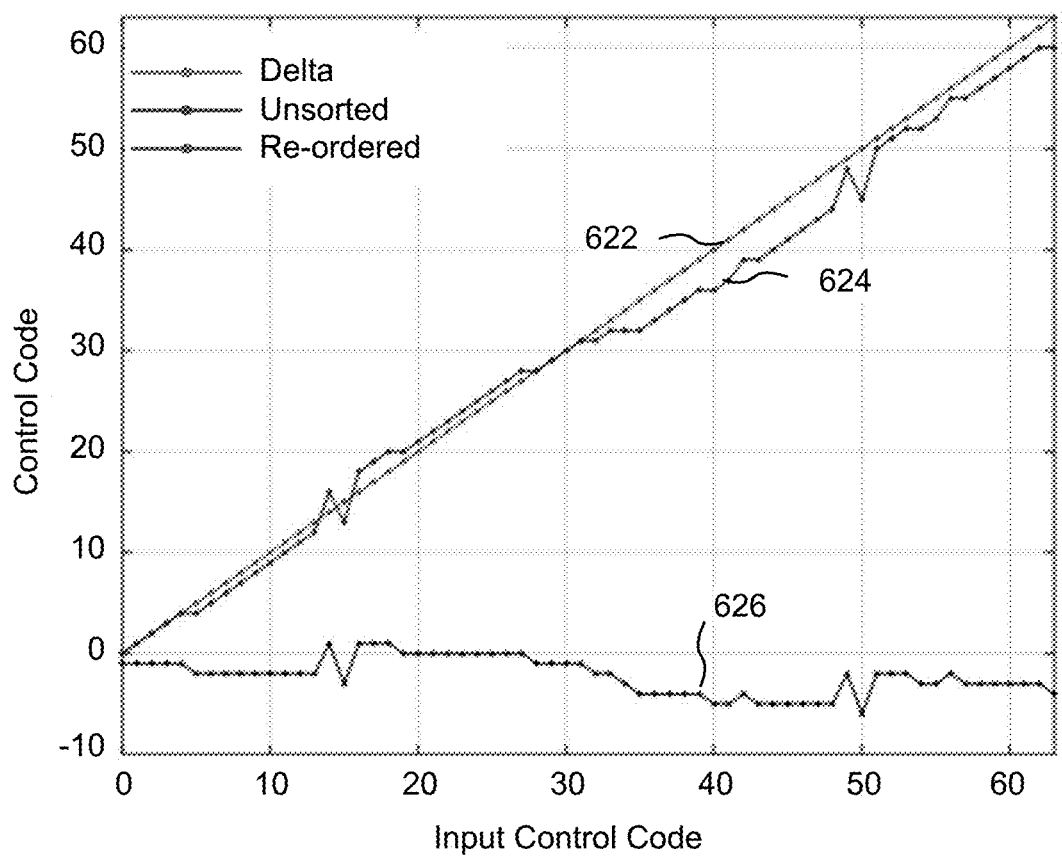
FIG. 6B is a graph of input control codes mapped to output control codes for the example shown in FIG. 6A.

FIG. 6B is a graph 620 of input control codes mapped to output control codes for the example shown in FIG. 6A. Graph line 622 shows a mapping of input control codes to unsorted control codes (i.e., control-in code=control-out code), while graph line 624 shows a mapping of input control codes to re-ordered output control codes. The differences (delta) between the unsorted output control codes and the re-ordered output control codes is shown in graph curve 626. As this example suggests, in most cases, the input control codes can be mapped to nearby (e.g., ±3 or 4) output control code values.

Figure 6C:
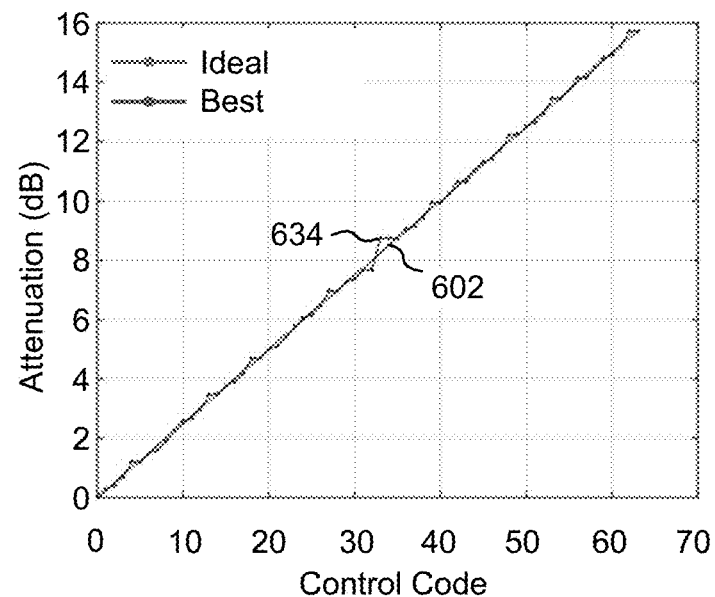
FIG. 6C is a graph of ideal attenuation and modeled actual multi-stage attenuation as a function of binary control codes for the DSA of FIG. 6A, using corrected and mapped input codes.

FIG. 6C is a graph 630 of ideal attenuation 602 and modeled actual multi-stage attenuation 634 as a function of binary control codes for the DSA of FIG. 6A, using corrected and mapped input codes. As the graph curve for the modeled actual multi-stage attenuation 634 shows, actual attenuation values are much closer to the ideal attenuation values 602 as a result of the code transformation described above.

Figure 6D:
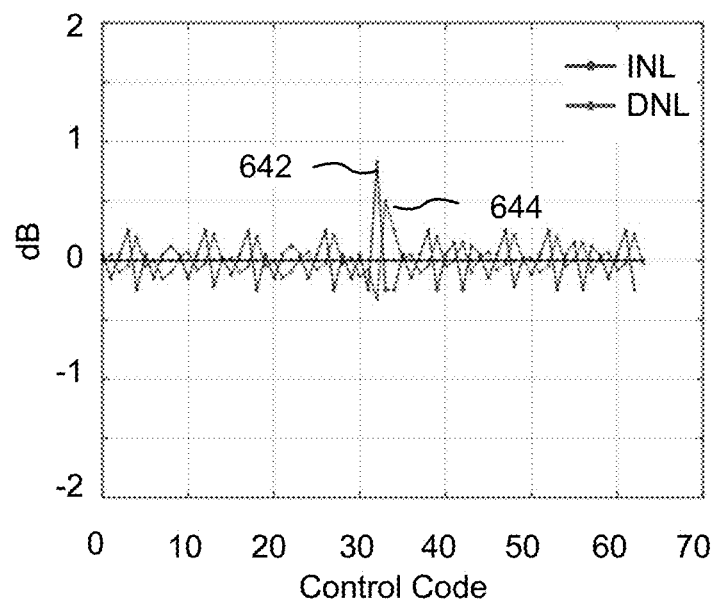
FIG. 6D is a graph of a differential non-linearity (DNL) measurement and an integral non-linearity (INL) measurement as a function of binary control codes for the corrected DSA represented in FIG. 6C.

FIG. 6D is a graph 640 of a differential non-linearity (DNL) measurement 642 and an integral non-linearity (INL) measurement 644 as a function of binary control codes for the corrected DSA represented in FIG. 6C. In this particular example, the INL RMS error improved from about 0.59 dB down to about 0.13 dB. while DNL RMS error went from about 0.23 dB to about 0.20 dB.

The transformation of M input control codes to a new set of M output control codes as described above can be mathematically represented as follows. Define:

$a_k$ =ideal response for input control code k, $k \in \{0, 1, \ldots, M\}$ $b_k$ =actual response for input control code k, $k \in \{0, 1, \ldots, M\}$ $c_k$ =optimized ("bit-reordered") output control code response for input control code k, $k \in \{0, 1, \ldots, M\}$ Then:

$$c_k = b_m, m = \arg\min\{|b_m - a_k|\}, k \in \{0, 1, \ldots, M\},$$

As with the sorting embodiment above, the codes that correspond to the set of "best fit" actual attenuation values are unlikely to be in sequential order. Accordingly, the input codes need to be mapped to the new order of codes corresponding to the sorted attenuation values in order to convert each input code to a mapped code, as in FIG. 6B. The mapping functionality may be implemented, for example, in a hardware or software implemented look-up table (LUT), as software implemented conditional statements, or in combinatorial logic circuitry. Mapping circuitry may be embodied on the same integrated circuit (IC) device as a multi-stage stepwise signal modification circuit or implemented externally to such an IC device. Details of one embodiment of mapping functionality are set forth below.

Again, the code transformation process described by way of a DSA example applies to any multi-stage stepwise signal modification circuit that exhibits accuracy errors of the type described above. In the examples set forth above, errors have only been described for "signal modification circuits" having binary-weighted stages. Another common way to build such circuits is using "thermometer-coded" stages in which each stage adds an equal increment to the total, rather than a binary-weighted increment. In some applications, a combination of binary and thermometer stages are used. Notably, the bit-reordering method described above works for all these embodiments.

Figure 7:
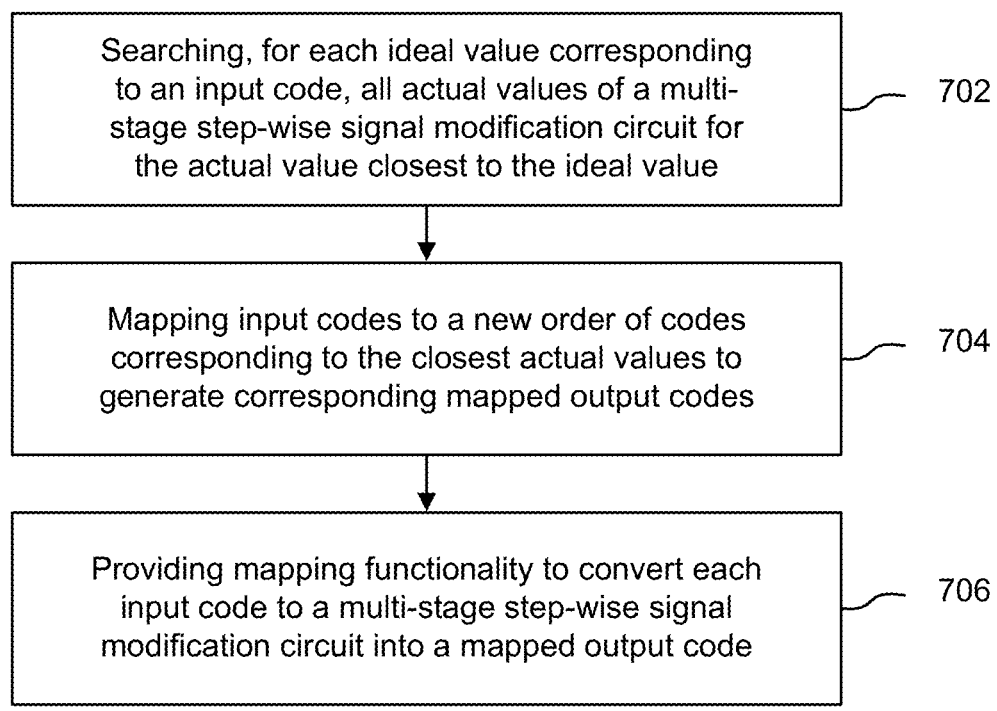
FIG. 7 is a process flow chart summarizing a second method for correcting accuracy errors in multi-stage stepwise signal modification circuits, using fitted and mapped input codes.

FIG. 7 is a process flow chart 700 summarizing a second method for correcting accuracy errors in multi-stage stepwise signal modification circuits, using fitted and mapped input codes. The process includes searching, for each ideal value corresponding to an input code, all actual values of a multi-stage stepwise signal modification circuit for the actual value closest to the ideal value (Block 702); mapping input codes to a new order of codes corresponding to the closest actual values to generate corresponding mapped output codes (Block 704); and providing mapping functionality to convert each input code to a multi-stage stepwise signal modification circuit into a mapped output code (Block 706).

Mapping Functionality

Figure 8:
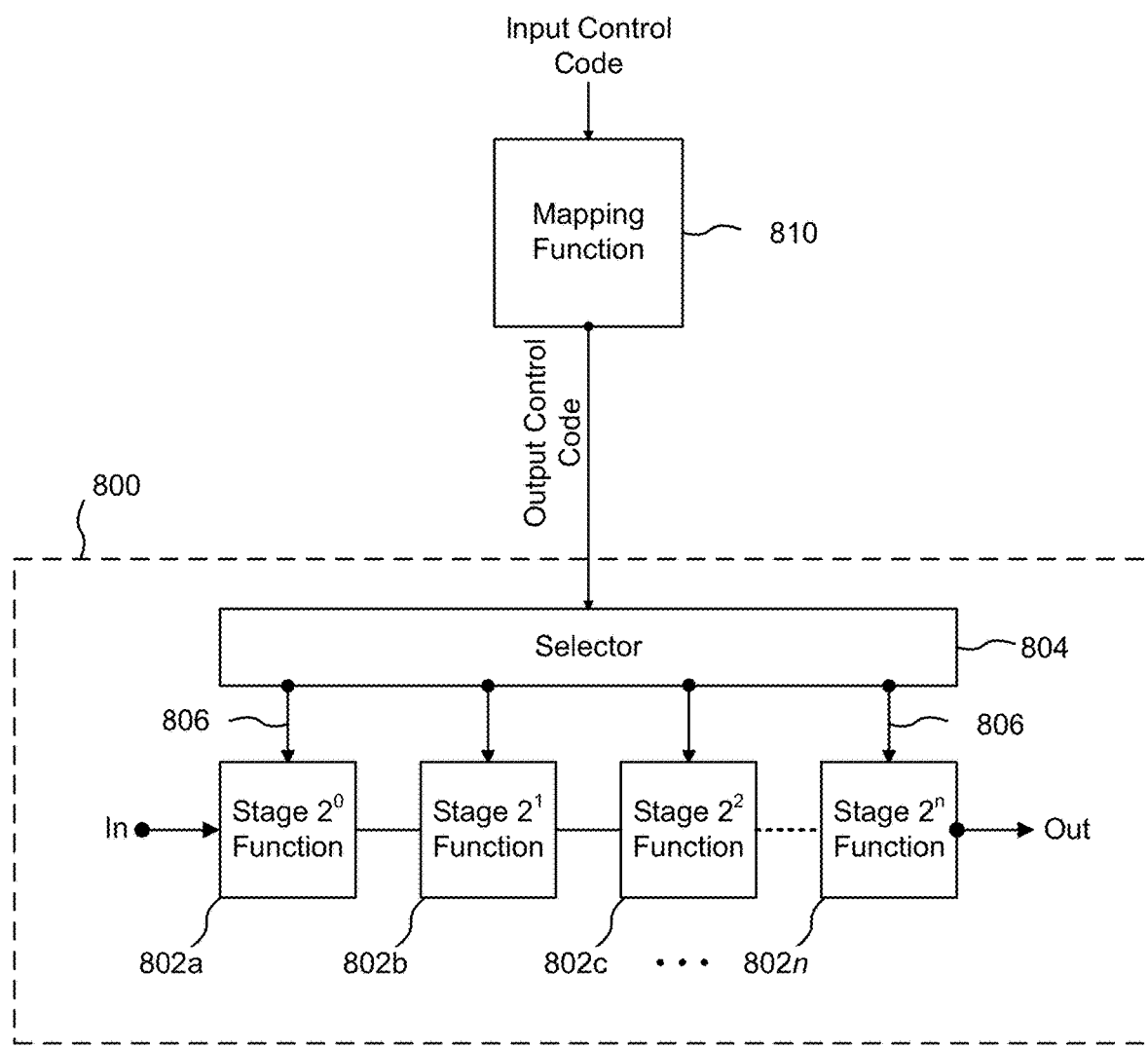
FIG. 8 is a block diagram of an example circuit that may be used to convert each input control code to a multi-stage stepwise signal modification circuit into a mapped output control code.

FIG. 8 is a block diagram of an example circuit that may be used to convert each input control code to a multi-stage stepwise signal modification circuit into a mapped output control code. A generalized multi-stage stepwise signal modification circuit 800 includes n series-connected signal modification stages 802a-802n, where n is an integer ≥2. Under the control of a selector 804 that decodes a supplied control code into individual control lines 806, each signal modification stage 802a-802n may be switched to an active state (e.g., an attenuation or phase shift state) or to an inactive state (e.g., a bypass or reference state). Each signal modification stage 802a-802n may be regarded as having a "bit position" associated with a corresponding control line 806.

Figure 1:
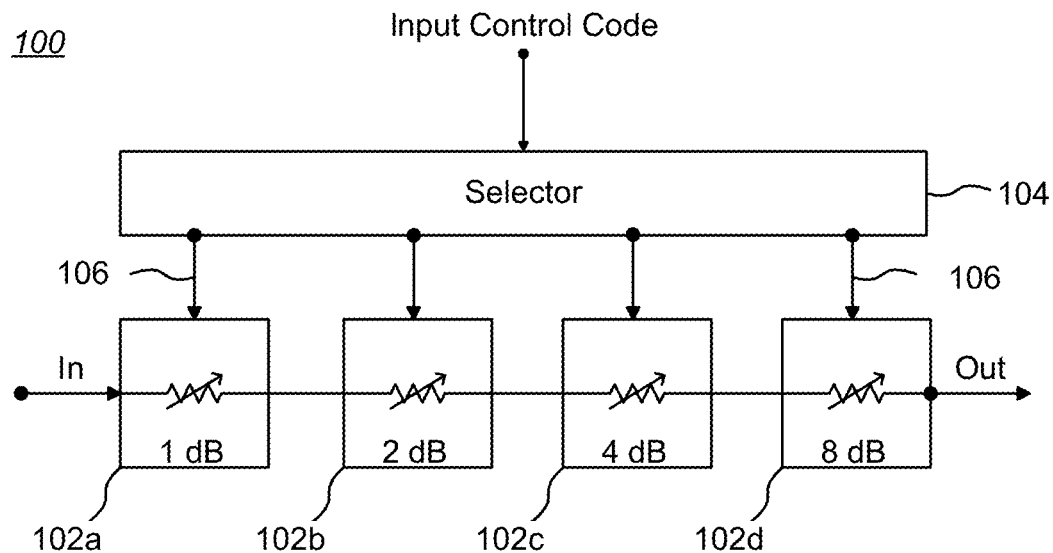
FIG. 1 is a schematic diagram of a prior art binary-weighted DSA.
Figure 2:
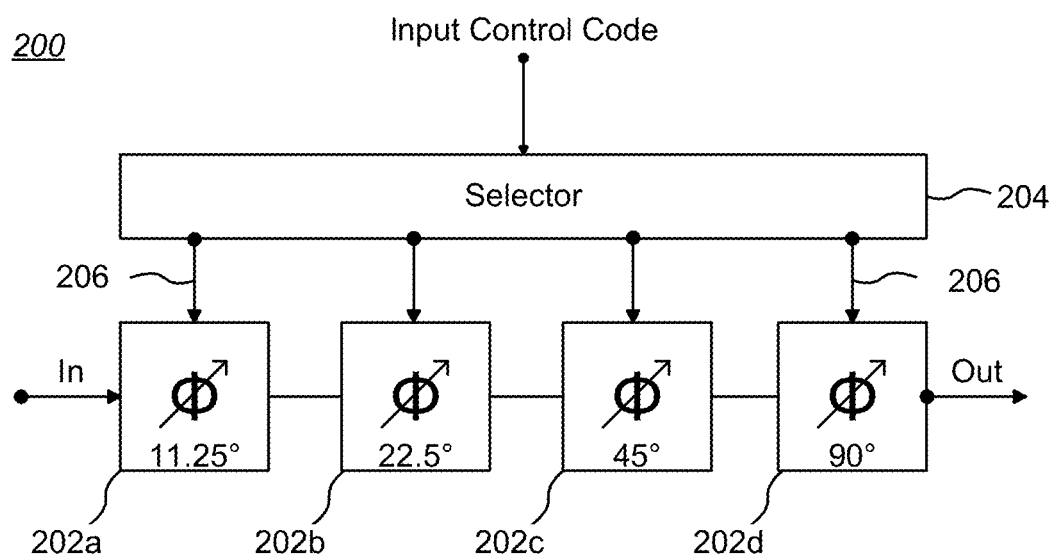
FIG. 2 is a schematic diagram of a prior art binary-weighted DPS.

In contrast to the examples in FIG. 1 and FIG. 2, an input control code is not applied directly to the selector 804, but is instead applied to a mapping function 810. The mapping function 810 maps each input control code to an output control code, which in turn is applied to the selector 804.

The mapping function 810 may be implemented in a hardware or software, such as a hardware addressable storage device or look-up table (e.g., RAM, ROM, PROM, etc.), or as software implemented look-up table or conditional statements (e.g., as part of device driver code), or in combinatorial logic circuitry. Circuitry implementing the mapping function 810 may be embodied on the same integrated circuit (IC) device as the multi-stage stepwise signal modification circuit 800 or implemented externally to such an IC device.

If the mapping function 810 is implemented as a simple look-up table, in the most general case the table size would be $2^N \times N$-bits ($2^N$ addresses×N-bit wide output, where N is an integer ≥1). However, as noted above, in the case of the code transformation embodiment, the input control codes generally can be mapped to nearby (e.g., ±3 or 4) values (see, e.g., graph line 626 in FIG. 6B). Since the output of the transformation is usually quite close to the input, the transformation can be implemented with a look-up table storing just the difference between the input control code and the output control code. The difference can be added to the input control code to effect the transformation or bit reordering. While this approach requires an adder circuit, such a circuit is generally smaller than the excess storage circuitry otherwise required.

Figure 9:
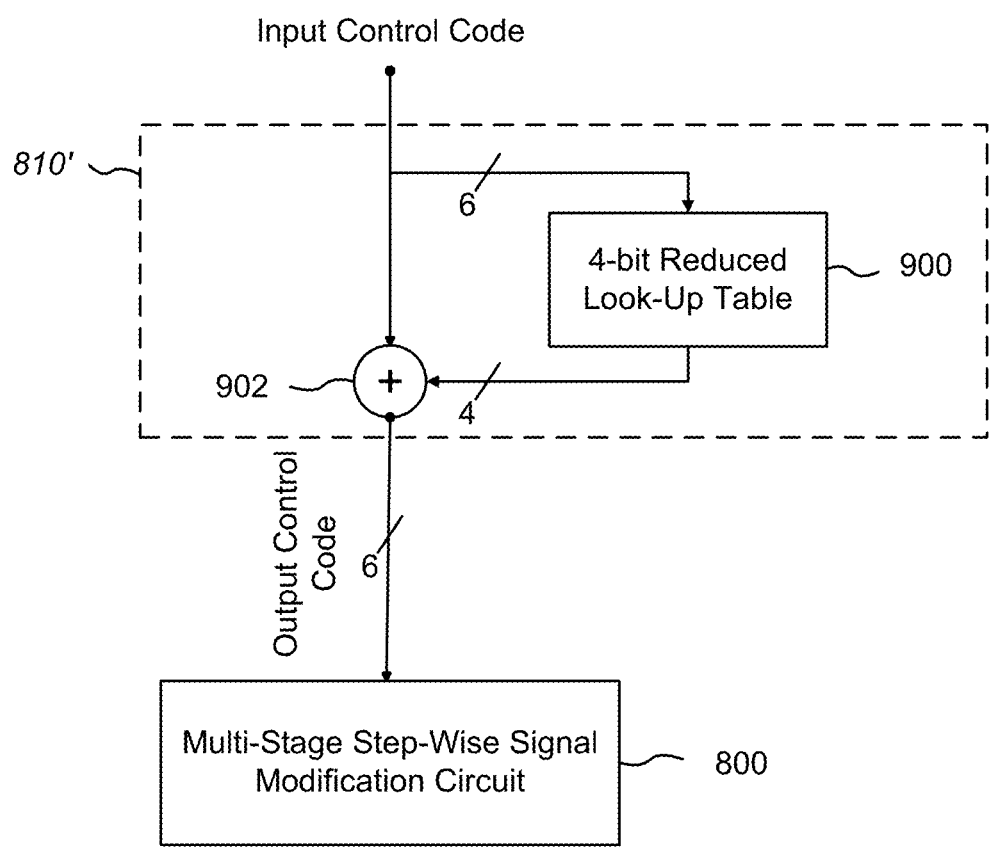
FIG. 9 is a block diagram of an example circuit that may be used to convert each input control code to a multi-stage stepwise signal modification circuit into a mapped output control code using a reduced look-up table.

For example, FIG. 9 is a block diagram of an example alternative mapping function circuit 810' that may be used to convert each input control code to a multi-stage stepwise signal modification circuit into a mapped output control code using a reduced look-up table having a less-wide output word or code (e.g., 4 bits rather than 6 bits). In the illustrated example, 6-bit input control codes are applied to a 4-bit reduced look-up table 900 and to an adder 902. The 4-bit output of the example reduced look-up table 900 is also applied to the adder 902. The 6-bit output of the adder 902 is the sum of a 6-bit input control code and the corresponding 4-bit output of the example reduced look-up table 900. The output of the adder 902 is then applied as an output control code to a multi-stage stepwise signal modification circuit 800, as in FIG. 8.

Using the example of graph line 626 in FIG. 6B, the error (i.e., the delta between the input control codes and the output control codes) falls in between −6 and +1. That range of values can be represented by a 4-bit signed number (i.e., −8 to +7). When a 6-bit input control code is applied to the reduced look-up table 900, a corresponding 4-bit delta value is output from the reduced look-up table 900 and added to the 6-bit input control code in the adder 902. As a result, for 6-bit input control codes, the reduced look-up table 900 is only 4/6 (i.e., 2/3) as large as if the adder 902 was not used. Of course, the input and output control words may have fewer than or more than 6 bits, and the size of the reduced look-up table 900 would be adjusted accordingly.

Note that, in this example, when adding a 4-bit signed number to a 6-bit unsigned number (like the input control codes), the result can be 7 bits due to underflow or overflow. However, this can be prevented by purposely limiting values in the reduced look-up table 900 for input control code values that are close to zero or to full-scale values, essentially clipping the corresponding output control codes to zero or full-scale values, respectively. The same principle applies to control codes having fewer than or more than 6 bits.

As mentioned above, accuracy errors may be reduced by redesign of a multi-stage stepwise signal modification circuit. However, for radio frequency circuits, some stages may behave differently at different frequencies. If so, then redesign may not correct as well across a range of frequencies. In contrast, embodiments of the present invention can utilize multiple mapping functions 810, one for each frequency range (e.g., VHF, UHF, etc.) and/or band (e.g., cellular radio bands B1, B2, B3, etc.). For example, a look-up table may have multiple pages, each page loaded with mapping transformations for different frequency ranges and/or bands. Selection of a specific page would be by one or more control signals that correlate to frequency range and/or band. A similar approach may be used to provide mapping transformations as a function of temperature for multi-stage stepwise signal modification circuit having stages that vary with temperature.

The mappings needed for either sorting embodiments or code transformation embodiments of the present invention may be determined from characterization data or calibration data. Characterization data may be obtained for a particular design of a multi-stage stepwise signal modification circuit by testing a sampling of circuits, determining a suitable mapping in accordance with the descriptions above, and applying that mapping to all manufactured units of the circuit. Calibration data may be obtained by testing each unit of a multi-stage stepwise signal modification circuit, determining a suitable mapping in accordance with the descriptions above, and applying that mapping to the tested unit of the circuit.

Somewhat surprisingly, using non-exact value stages in a multi-stage stepwise signal modification circuit often provides additional design flexibility. For example, in a DSA, the IC layout of a particular non-exact attenuation stage value may scale better than the exact value.

Extended Accuracy

Knowing at the design stage that a bit-reordering code transformation is planned for a particular multi-stage stepwise signal modification circuit, there are some design changes that will further improve accuracy results. This section describes three approaches for extending accuracy with respect to a multi-stage stepwise signal modification circuit to which bit-reordering code transformation is applied: fine bit resolution overprovisioning, negative biasing of one or more stages, and added fractional MSB.

Fine Bit Resolution Overprovisioning:

An extra M bits of resolution (where M is an integer ≥1) may be added in order to reduce the resolution noise by mapping an N-bit input control code (where N is an integer ≥2) to (N+M) signal modification stages to select a best-fit (N+M)-bit output control code. The "overprovisioning" bit or bits of resolution may be provided by one or more relatively small added LSB stages ("tweak bits"), such as one-half of the "normal" LSB stage value that would otherwise exist without overprovisioning.

For example, FIG. 10A is a graph 1000 of ideal attenuation 1002 and modeled actual multi-stage attenuation 1004 as a function of binary control codes for a 5-bit DSA, using corrected and mapped input codes. FIG. 10B is a graph 1020 of ideal attenuation 1002 and modeled actual multi-stage attenuation 1024 as a function of binary control codes for the 5-bit DSA of FIG. 10A, using an extra bit of resolution, smaller in value than the LSB of the configuration of FIG. 10A, to map output codes. As can be seen, the graph curve 1024 of FIG. 10B lies closer to the ideal attenuation line 1002 than does the graph curve 1004 of FIG. 10A, indicating less error. Numerically, the RMS INL of the system of FIG. 10A is about 0.22 dB, while the RMS INL of the system of FIG. 10B is about 0.13 dB.

Accordingly, embodiments of the invention may use overprovisioning to provide a number of possible states (e.g., $2^{(N+1)}$, $2^{(N+2)}$, etc.) that is larger than the number of desired output states to increase the possibility of a best-fit of N-bit input control codes to (N+M)-bit output control codes. Further discussion of overprovisioning may be found in the above-referenced patent application entitled "Reflection-Based RF Phase Shifter".

Negative Biasing of One or More Stages:

If a designer knows where problem bits or error are likely to occur, the designer can adjust the design to compensate knowing that bit-reordering code transformation is available. For instance, if the MSB stage typically results in the largest error, one can design the MSB stage to be intentionally smaller in value than some ideal value (e.g., 7 dB rather than 8 dB). Achieving the targeted original MSB value may require a combination of the smaller MSB stage plus some combination of lesser valued stages, but at least a solution will exist by design and accordingly the targeted original MSB value will not be skipped over in re-ordering (although a tradeoff is reduced overall range).

For example, FIG. 11A is a graph 1100 of ideal attenuation 1102, original multi-stage attenuation 1104, and reordered multi-stage attenuation 1106, all as a function of binary control codes for a 6-bit DSA. Due to a relatively large error in the MSB stage, there is a large jump in output attenuation when the MSB stage is activated (see oval 1108), leading to an essentially constant error in all higher output values. Reordering the control codes as described above provides a significant reduction in overall error, but an appreciable error remains where the MSB stage error cannot be fully compensated (again see oval 1108).

Substituting an MSB stage smaller in value than the original MSB stage often allows a re-ordering that is closer to ideal. For example, FIG. 11B is a graph 1120 of ideal attenuation 1102, original multi-stage attenuation 1124 using a lesser-valued MSB stage, and reordered multi-stage attenuation 1126, all as a function of binary control codes for a 6-bit DSA. When the MSB stage is activated (see oval 1128), some level of MSB error is incurred for all higher output values. However, by purposefully designing the MSB stage to have less attenuation when activated compared to the MSB stage in the configuration of FIG. 11A, the MSB error falls below the ideal attenuation 1102 level (that is, biased negatively) and consequently can be compensated by reordering. Essentially, reordering shifts the upper range of MSB error (MSB+combinations of LSB) downward to overlap the lower range of reordered values. As noted above, a tradeoff is reduced overall range, shown by the flattened output attenuation within the oval 1129 (that is, control code values beyond about 59 do not generate a different output attenuation).

The binary errors illustrated in FIG. 11A are common for DSA's and DPS's. It is apparent that abrupt steps in values when each stage level is activated or deactivated cause most of the uncorrectable error. For a more general understanding of such errors, consider how these steps come about. Taking a DSA as an example, the actual response for the $k^{th}$ control word is given by:

$$b_k = \sum_{i=0}^{N-1} \gamma_i \alpha_i$$

where $\gamma_i$ is the $i^{th}$ coefficient in the binary expansion of k, and $\alpha_i$ is the actual attenuation of the $i^{th}$ stage. We can express the actual attenuation of a stage in terms of the stage ideal attenuation $2^i \Delta$ and the stage attenuation error $e_i$: $\alpha_i = 2^i \Delta + e_i$. Thus, the total attenuation error is given by:

$$\varepsilon_k = \sum_{i=0}^{N-1} \gamma_i e_i.$$

Larger attenuation stages tend to have larger errors. Consider a 6-bit attenuator with the following stage error vectors: [1, 0, 0, 0, 0, 0] and [X, 1, 0, 0, 0, 0], where X is 0 or 1 (i.e., a "don't care" value). FIG. 11A includes a graphical plot of the resulting characteristics for the error vector [1, 0, 0, 0, 0, 0] (i.e., the "MSB error" portion of the original multi-stage attenuation 1104 graph line). FIG. 11C is a graph 1130 of the resulting characteristics for the error vector [X, 1, 0, 0, 0, 0] for the 6-bit DSA of FIG. 11A.

As shown in oval 1108 of FIG. 11A, the largest error is associated with the change from [0, 1, 0, 0, 0, 0] to [1, 0, 0, 0, 0, 0] when the MSB stage (i.e., the $N^{th}$ stage) is activated; see the abrupt step in oval 1108 in FIG. 11A. The second largest error occurs between [X, 0, 1, 1, 1, 1] and [X, 1, 0, 0, 0, 0], when the next most significant bit stage (i.e., the $N^{th}-1$ stage) is activated; see the abrupt steps in ovals 1138a and 1138b in FIG. 11C for the original multi-stage attenuation shown by graph lines 1134a and 1134b. Similar (but generally lesser) errors could be plotted corresponding to the activation of each less significant bit stage. As the graph line 1136 for the reordered multi-stage attenuation configuration shows, the abrupt steps in ovals 1138a and 1138b were uncorrectable by the reordering process.

Notably, the plotted errors can be minimized if the errors are biased negatively with respect to the ideal attenuation 1102 plot line, since only positive jumps in error make uncorrectable gaps using the reordering method described above. For example, assume attenuation stage errors are uniformly distributed between $-2^i \Delta/8$ dB and $+2^i \Delta/8$ dB. Accordingly, an 8 dB stage would have error somewhere between ±1 dB, a 4 dB stage would have error somewhere between ±0.5 dB, etc. One aspect of some embodiments of the invention is to bias errors proportionally negative. For instance, a reasonable compromise would be to target stage attenuation values at 7, 3.5, 2, 1, 0.5, and 0.25 dB, instead of conventional values of 8, 4, 2, 1, 0.5, and 0.25 dB. Thus, the top two most significant bits would be weighted at 7 dB and 3.5 dB rather than at 8 dB and 4 dB.

As described above, FIG. 11B shows the effect of biasing the MSB stage negatively (by using an MSB stage value of 7 dB in this example; note that errors from other stages are ignored in FIG. 11B). Similarly, FIG. 11D is a graph 1140 of the resulting characteristics for the error vector [X, 1, 0, 0, 0, 0] for the 6-bit DSA of FIG. 11A, but using a negatively biased next most significant bit stage (i.e., the $N^{th}-1$ stage). Graph lines 1144a and 1144b of FIG. 11D show the resulting negatively biased error of the original (unsorted) output attenuation as a function of control code. Graph line 1146 for the reordered multi-stage attenuation configuration shows that the original abrupt steps in ovals 1138a and 1138b of FIG. 11C were correctable by the reordering process by essentially shifting the upper range of reordered values downward to overlap the lower range of reordered values.

Another way of looking at the process is that negatively biasing some stages with respect to the ideal attenuation level moves the location of error commencement (e.g., within oval 1108 of FIG. 11A, and ovals 1138a and 1138b of FIG. 11C) to the top of the range of each such stage. Importantly, by applying the above-described reordering process, moved error commencement generally can be corrected along with reordering correction of the next larger stage (with the total remaining error being move to the top of the range of the combined stages). Thus, for example, in FIG. 11D, all of the uncorrectable error for the $N^{th}-1$ stage is moved to around control code values 30 and 60. The error near control code value 30 generally can be corrected when correcting the $N^{th}$ stage by applying the above-described reordering process.

FIG. 11B shows the negative bias of the MSB stage (i.e., the $N^{th}$ stage) for the original multi-stage attenuation 1124 using a lesser-valued stage compared to FIG. 11A. Similarly, FIG. 11D shows the negative bias of the next most significant bit stage (i.e., the $N^{th}-1$ stage) for the original multi-stage attenuation 1124 using a lesser-valued stage compared to FIG. 11C. FIG. 11E is a graph 1150 showing plots of the combined negative bias and resulting reordering error correction of the embodiments shown in FIGS. 11B and 11D. Graph line 1154 is essentially the vector sum of graph line 1124 of FIG. 11B and graph lines 1144a and 1144b of FIG. 11D. Graph line 1156 for the reordered multi-stage attenuation configuration shows that the abrupt steps in oval 1108 of FIG. 11A and ovals 1138a and 1138b of FIG. 11C were correctable by the reordering process by essentially shifting the upper range of reordered values downward to overlap the lower range of reordered values, with some slight loss of overall range.

Added Fractional MSB:

A third design modification for enhancing accuracy takes advantage of the above-described bit reordering technique by adding a fractional MSB stage. For example, FIG. 12A is a graph 1200 of ideal attenuation 1102, original multi-stage attenuation 1204, and reordered multi-stage attenuation 1206, all as a function of binary control codes for an example 6-bit DSA in which the amount of error is uncorrectable using just bit reordering.

Accuracy of the DSA can be enhanced by adding an intermediate stage that has a fractional value relative to the MSB stage. For example, in FIG. 12A, the jumps in error are due to the control code transitions from [0, 1, 0, 0, 0, 0] to [1, 0, 0, 0, 0, 0], and from [X, 0, 1, 1, 1, 1] to [X, 1, 0, 0, 0, 0]. By adding an extra attenuation stage that is less than one-half the MSB stage attenuation (such as 3 dB in this example), the jumps can be corrected by applying a reordering transformation as described above. For example, FIG. 12B is a graph 1220 of ideal attenuation 1102, original multi-stage attenuation 1224 with an added fractional stage, and reordered multi-stage attenuation 1226, all as a function of binary control codes for an example 6-bit DSA having 6 input control bits mapped to a 7-bit DSA core. As can be seen, by being able to include the added fractional stage in the reordering process, the jumps seen in FIG. 12 are corrected. Further, while the full 7-bit range of attenuation is decreased, the actual range of attenuation is increase compared to the DSA of FIG. 12A.

Combinations of Accuracy Enhancement Techniques:

Two or more of the three accuracy enhancement techniques described above—fine bit resolution overprovisioning, negative biasing of one or more stages, and added fractional MSB—may be combined in embodiments of the invention. Adding an attenuator stage may increase insertion loss, which may be acceptable for systems in which accuracy is paramount. On the other hand, negative biasing of one or more stages causes no extra insertion loss, with the tradeoff of some decrease in range. Accordingly, this aspect of the invention gives a designer great flexibility in enhancing the accuracy of a multi-stage stepwise signal modification circuit in conjunction with the reordering techniques described above.

Two-Dimensional Remapping

Some RF applications utilize both a phase shifting multi-stage stepwise signal modification circuit and an attenuation multi-stage stepwise signal modification circuit in series. Many embodiments of phase shifting circuits influence the attenuation level of an input RF signal as a function of selected phase shift degree, and many embodiments of attenuator circuits influence the phase of an input RF signal as a function of selected attenuation level. Accordingly, series coupling of phase shifting circuit and an attenuation circuit (in either order) presents a complication where selecting a desired final degree of phase shift and level of attenuation is a function of two interdependent circuits.

This complication can be overcome by essentially treating the concatenated circuits as a single "two dimensional" (or "2-D") multi-stage stepwise signal modification circuit that modifies both phase and amplitude. Thus, the reordering techniques described above may be applied to the 2-D circuit, for example, by mapping each combination of phase and attenuation input control codes to corresponding output control codes representing a listing of closest actual values (phase and amplitude) generated by the 2-D circuit. Further discussion of 2-D mapping, using a different method of correction, may be found in the above-referenced patent application entitled "State Change Stabilization in a Phase Shifter/Attenuator Circuit".

Additional Methods

The methods described above with respect to FIG. 5 and FIG. 7 may be augmented by including one or more of the following aspects: wherein the multi-stage stepwise signal modification circuit includes at least one of a digital phase shifter (DPS) circuit and/or a digital step attenuator (DSA) circuit; wherein the multi-stage stepwise signal modification circuit modifies signals having a frequency of at least 100 MHz; wherein the multi-stage stepwise signal modification circuit is fabricated as MOSFET circuitry; wherein the multi-stage stepwise signal modification circuit is fabricated using a silicon-on-insulator (SOI) fabrication process; wherein the mapping functionality circuit is configured to map N input control codes to N+M output control codes, where N is an integer ≥2, and M is an integer ≥1; and/or wherein the multi-stage stepwise signal modification circuit modifies both signal phase and signal amplitude as a function of phase and attenuation input control codes, and wherein the mapping functionality circuit is further configured to map each combination of phase and attenuation input control codes to output control codes representing a listing of closest actual phase and amplitude values generated by the multi-stage stepwise signal modification circuit.

Fabrication Technologies & Options

As should be readily apparent to one of ordinary skill in the art, various embodiments of the invention can be implemented to meet a wide variety of specifications. In particular, selection of suitable components and component values for multi-stage stepwise signal modification circuits and/or mapping function circuits is a matter of design choice and various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). The invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (particularly radio frequencies of at least 100 MHz and including up to and exceeding 50 GHz). Monolithic IC implementation is particularly useful since parasitic capacitances generally can be kept low (or at a minimum, kept uniform across all units, permitting them to be compensated) by careful design.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this specification, the term "radio frequency" (RF) refers a rate of oscillation in the range of about 3 kHz to about 300 GHz. This term also includes the frequencies used in wireless communication systems. An RF frequency may be the frequency of an electromagnetic wave or of an alternating voltage or current in a circuit.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A circuit for correcting accuracy errors in a multi-stage stepwise signal modification circuit configured to receive a plurality of control codes each determining a level of signal modification by one or more stages of signal modification circuitry, the circuit including a mapping functionality circuit coupled between the multi-stage stepwise signal modification circuit and a source of input control codes, the mapping functionality circuit configured to map the input control codes to output control codes representing a monotonic sorted listing of actual values generated by the multi-stage stepwise signal modification circuit, wherein the mapping functionality circuit includes (a) a reduced look-up table of mapping values configured to convert an n-bit wide input control code to a less-wide mapped code, and (b) an adder circuit, configured to receive and sum the n-bit wide input control code and the less-wide mapped code so as to generated an n-bit wide output control code, and wherein the output control codes from the mapping functionality circuit are provided to the multi-stage stepwise signal modification circuit as the plurality of control codes.

2. The invention of claim 1, wherein the reduced look-up table has a plurality of pages of mapping values.

3. The invention of claim 1, wherein the reduced look-up table has a plurality of pages of mapping values, each page corresponding to a selected radio frequency range and/or band.

4. The invention of claim 1, wherein the multi-stage stepwise signal modification circuit includes at least one of a digital phase shifter (DPS) circuit and/or a digital step attenuator (DSA) circuit.

5. The invention of claim 1, wherein the multi-stage stepwise signal modification circuit modifies signals having a frequency of at least 100 MHz.

6. The invention of claim 1, wherein the multi-stage stepwise signal modification circuit is fabricated as MOSFET circuitry.

7. The invention of claim 1, wherein the multi-stage stepwise signal modification circuit is fabricated using a silicon-on-insulator (SOI) fabrication process.

8. A circuit for correcting accuracy errors in a multi-stage stepwise signal modification circuit configured to receive a plurality of control codes each determining a level of signal modification by one or more stages of signal modification circuitry, the circuit including a mapping functionality circuit coupled between the multi-stage stepwise signal modification circuit and a source of input control codes, the mapping functionality circuit configured to map the input control codes to output control codes representing a listing of closest actual values generated by the multi-stage stepwise signal modification circuit, wherein the output control codes from the mapping functionality circuit are provided to the multi-stage stepwise signal modification circuit as the plurality of control codes.

9. The invention of claim 8, wherein the mapping functionality circuit includes a look-up table of mapping values configured to convert an n-bit wide input control code to an n-bit wide control output code.

10. The invention of claim 9, wherein the look-up table has a plurality of pages of mapping values.

11. The invention of claim 9, wherein the look-up table has a plurality of pages of mapping values, each page corresponding to a selected radio frequency range and/or band.

12. The invention of claim 8, wherein the mapping functionality circuit includes:
    (a) a reduced look-up table of mapping values configured to convert an n-bit wide input control code to a less-wide mapped code; and
    (b) an adder circuit, configured to receive and sum the n-bit wide input control code and the less-wide mapped code so as to generated an n-bit wide output control code.

13. The invention of claim 12, wherein the look-up table has a plurality of pages of mapping values.

14. The invention of claim 12, wherein the look-up table has a plurality of pages of mapping values, each page corresponding to a selected radio frequency range and/or band.

15. The invention of claim 8, wherein the multi-stage stepwise signal modification circuit includes at least one of a digital phase shifter (DPS) circuit and/or a digital step attenuator (DSA) circuit.

16. The invention of claim 8, wherein the multi-stage stepwise signal modification circuit modifies signals having a frequency of at least 100 MHz.

17. The invention of claim 8, wherein the multi-stage stepwise signal modification circuit is fabricated as MOSFET circuitry.

18. The invention of claim 8, wherein the multi-stage stepwise signal modification circuit is fabricated using a silicon-on-insulator (SOI) fabrication process.

19. The invention of claim 8, wherein the mapping functionality circuit is configured to map N input control codes to N+M output control codes, where N is an integer $\geq 2$, and M is an integer $\geq 1$.

20. The invention of claim 8, wherein the multi-stage stepwise signal modification circuit modifies both signal phase and signal amplitude as a function of phase and attenuation input control codes, and wherein the mapping functionality circuit is further configured to map each combination of phase and attenuation input control codes to output control codes representing a listing of closest actual phase and amplitude values generated by the multistage stepwise signal modification circuit.

* * * * *